US011362101B2

(12) United States Patent
Chiu et al.

(10) Patent No.: US 11,362,101 B2
(45) Date of Patent: Jun. 14, 2022

(54) THREE DIMENSIONAL MEMORY DEVICE

(71) Applicant: MACRONIX INTERNATIONAL CO., LTD., Hsinchu (TW)

(72) Inventors: Chien-Lan Chiu, Yunlin County (TW); Chun-Min Cheng, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 293 days.

(21) Appl. No.: 16/809,719

(22) Filed: Mar. 5, 2020

(65) Prior Publication Data
US 2021/0280596 A1 Sep. 9, 2021

(51) Int. Cl.
*H01L 27/11556* (2017.01)
*H01L 27/11582* (2017.01)
*G11C 5/06* (2006.01)
*G11C 5/02* (2006.01)
*H01L 27/06* (2006.01)

(52) U.S. Cl.
CPC ........ *H01L 27/11556* (2013.01); *G11C 5/025* (2013.01); *G11C 5/06* (2013.01); *H01L 27/0688* (2013.01); *H01L 27/11582* (2013.01)

(58) Field of Classification Search
CPC ........... H01L 27/11556; H01L 27/0688; H01L 27/11582; H01L 27/11575; H01L 27/11573; G11C 5/025; G11C 5/06
See application file for complete search history.

(56) References Cited

U.S. PATENT DOCUMENTS

| | | | |
|---|---|---|---|
| 2010/0120202 A1* | 5/2010 | Wu | H01L 29/0657 438/106 |
| 2011/0207322 A1 | 8/2011 | Yamaguchi | |
| 2014/0374879 A1* | 12/2014 | Chen | H01L 28/40 257/532 |
| 2015/0364362 A1* | 12/2015 | Engbrecht | H01L 21/3081 438/697 |
| 2016/0329343 A1 | 11/2016 | Pachamuthu et al. | |
| 2017/0323899 A1* | 11/2017 | Park | H01L 21/02359 |
| 2019/0043874 A1* | 2/2019 | Thimmegowda | H01L 27/11575 |
| 2020/0227555 A1* | 7/2020 | Sun | G11C 16/0466 |

* cited by examiner

*Primary Examiner* — Sitaramarao S Yechuri
(74) *Attorney, Agent, or Firm* — McClure, Qualey & Rodack, LLP

(57) ABSTRACT

A three-dimensional memory device includes a plurality of conductive layers and insulating layers alternately formed to define a multi-layer stacked structure on a first region of a semiconductor substrate. The multi-layer stacked structure includes a stair structure and a non-stair structure. A plurality of memory structures are located in the non-stair structure to form a memory array region, and each memory structure passes through the conductive layers and the insulating layers. A plurality of bow-height adjustment features are located in a second region of the semiconductor substrate.

17 Claims, 8 Drawing Sheets

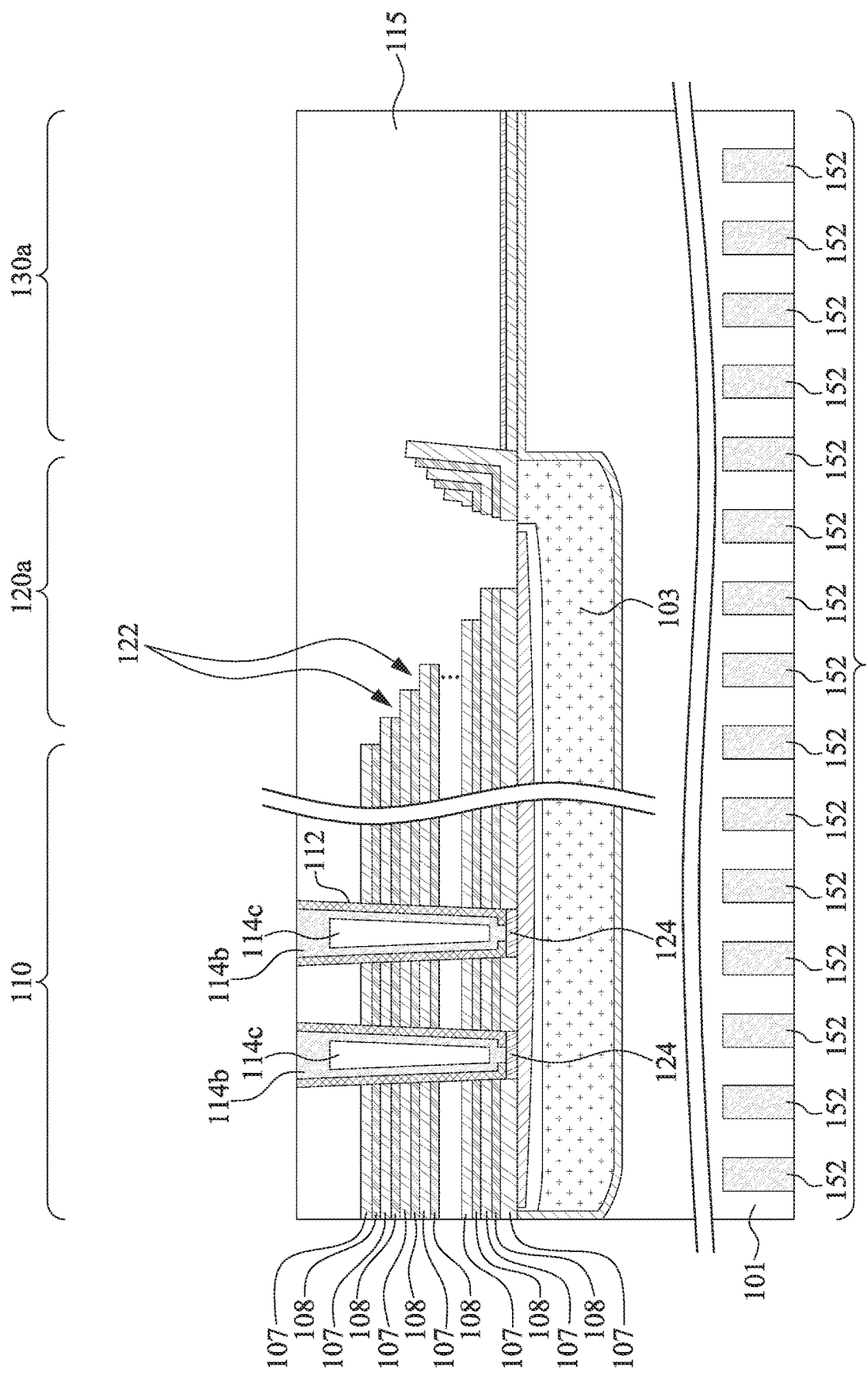

THREE DIMENSIONAL MEMORY DEVICE

BACKGROUND

Field of Invention

The present disclosure relates to a memory device and method for fabricating the same, and more particularly to a high-density three dimensional memory device and method for fabricating the same.

Description of Related Art

Memory devices are important device to a portable electric apparatus, such as a MP3 displayer, a digital camera, a notebook, a cell phone . . . and so on, for data storage. As the increasing applications and functions required by the users, the trend for the memory devices pursues higher storage density and smaller cell size. To satisfy this requirement, designers have been looking for techniques to provide a 3D memory device with stacked multiple planes of memory cells, such as a vertical-channel (VC) NAND flash memory device.

However, as critical dimensions of devices in integrated circuits shrink to the limits of common memory cell technologies, how to achieve greater storage capacity within a smaller memory device without deteriorate its operation performance have become a challenge to the persons skilled in the art. Therefore, there is a need of providing an improved 3D memory device and the method for fabricating the same to obviate the drawbacks, e.g., wafer bow height issues, encountered from the prior art.

SUMMARY

One aspect of the present disclosure is to provide a three-dimensional memory device including a plurality of conductive layers and insulating layers alternately formed to define a multi-layer stacked structure on a first region of a semiconductor substrate, wherein the multi-layer stacked structure includes a stair structure and a non-stair structure. A plurality of memory structures are located in the non-stair structure to form a memory array region, and each memory structure passes through the conductive layers and the insulating layers. A plurality of bow-height adjustment features are located in a second region of the semiconductor substrate.

Another aspect of the present disclosure is to provide a three-dimensional memory device including a plurality of conductive layers and insulating layers alternately formed to define a multi-layer stacked structure on a first region of a semiconductor substrate. A plurality of memory structures each passes through the conductive layers and the insulating layers. A second region of the semiconductor substrate is adjacent to the first region, the first and second regions are located on a same side of the semiconductor substrate. A plurality of bow-height adjustment features are located in a third region of the semiconductor substrate located on a side of the semiconductor substrate that is opposite to the side on which the first and second regions are located.

In one or more embodiments, the stair structure includes a plurality of steps, and each step includes an immediately-adjacent pair of the conductive layers and insulating layers.

In one or more embodiments, the stair structure is closer to the second region than the non-stair structure.

In one or more embodiments, the bow-height adjustment features are electrically insulated from the memory structures or the conductive layers.

In one or more embodiments, the bow-height adjustment features are electrically insulated from one another.

In one or more embodiments, each memory structure includes a storage layer and a channel layer, the bow-height adjustment features and the channel layer are made from the same material.

In one or more embodiments, the bow-height adjustment features occupy at least 10% of an area of the second region.

In one or more embodiments, the bow-height adjustment features and the multi-layer stacked structure are disposed on the same side of the semiconductor substrate.

In one or more embodiments, each of the memory structures comprises gate-all-around transistors.

In one or more embodiments, the bow-height adjustment features and the multi-layer stacked structure are disposed on opposite sides of the semiconductor substrate.

In sum, a three-dimensional semiconductor memory device is equipped with bow-height adjustment features in the peripheral regions. The bow-height adjustment features are configured to compensate wafer level bow heights resulted from wafer warpage. The bow-height adjustment features may be poly silicon plugs or poly silicon pads that are located on the same side or on opposite sides of the semiconductor substrate, e.g., the second and third regions of semiconductor substrate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 8 illustrates a cross-sectional view of a semiconductor memory device in accordance with another embodiment of the present disclosure.

DETAILED DESCRIPTION

Figure 1:
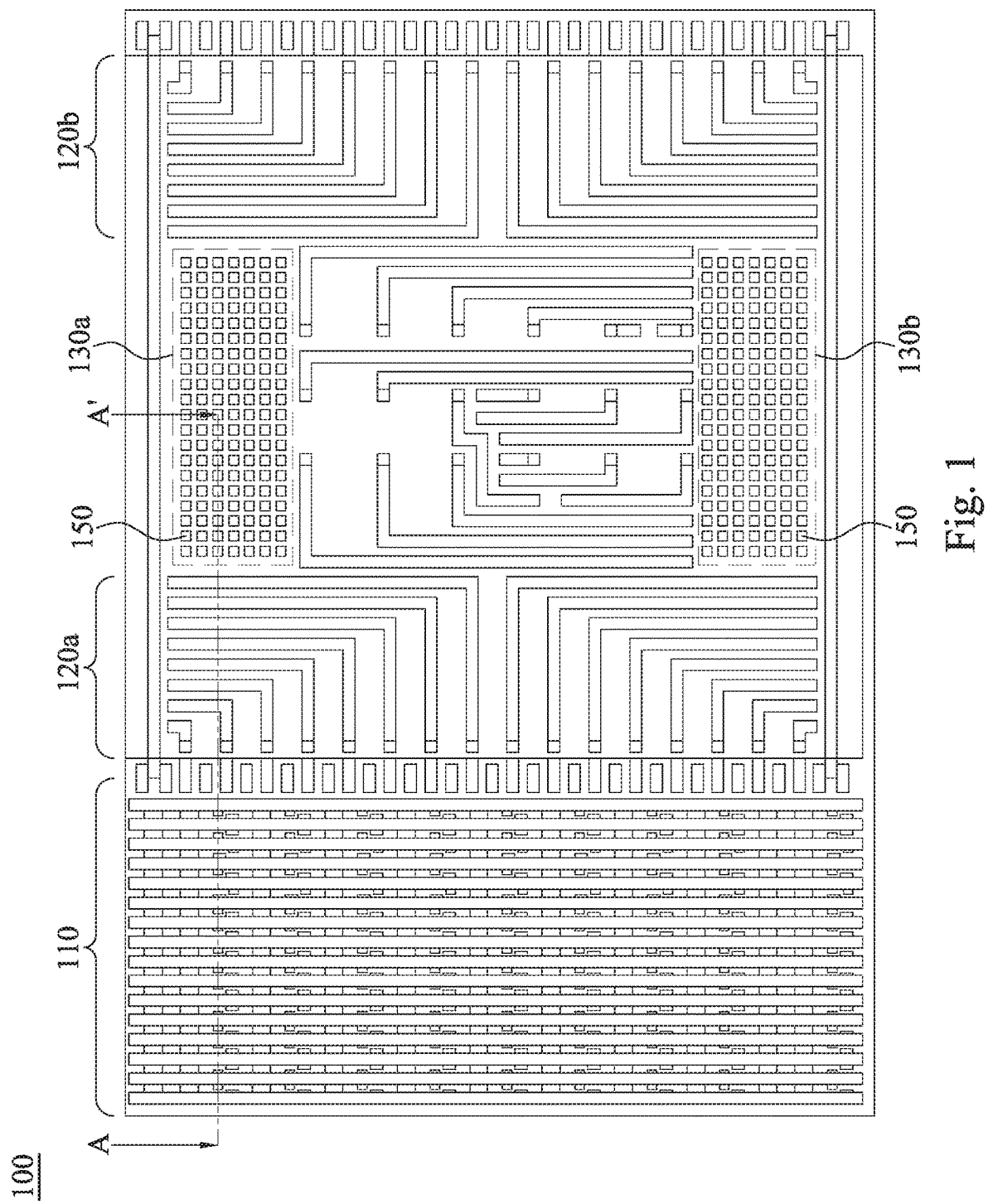
FIG. 1 illustrates a top view of a semiconductor memory device in accordance with one embodiment of the present disclosure.

The embodiments as illustrated below provide a 3D memory device and the method for fabricating the same to achieve greater storage capacity within a smaller memory device without deteriorating its operation performance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. It is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Reference is made to FIG. 1, which illustrates a top view of a semiconductor memory device, e.g., a single die, in accordance with one embodiment of the present disclosure. A semiconductor memory device 100 includes a memory array region 110, bonding pad regions (120a, 120b) and peripheral regions (130a, 130b). Bow-height adjustment features 150 are densely formed within the peripheral regions (130a, 130b) to minimize wafer level bow heights resulted from wafer warpage. In this embodiment, each peripheral region (130a or 130b) is located between adjacent bonding pad regions (120a, 120b), but not being limited thereto. The peripheral regions may be referred to the regions on which WL decoders, BL decoders, Page buffer, charge pumps and/or microcontrollers, etc. are located.

Reference is made to FIGS. 2-7 illustrate cross-sectional views (taken along the line A-A' in FIG. 1) of a method for manufacturing a semiconductor memory device at various stages in accordance with one embodiment of the present disclosure. The semiconductor memory device 100 is formed by alternately depositing two different insulating layers (107, 109) over an active region, i.e., a first region 103, of a semiconductor substrate 101 to form a multi-layer stacked structure.

In the present embodiment, the two different insulating layers (107, 109) may be silicon oxide layers and silicon nitride layers respectively. In other embodiments, the two different insulating layers may be two of the dielectric materials such as silicon oxide, silicon nitride, silicon oxynitride, silicate, etc. In some embodiments, the two different insulating layers (107, 109) are chosen from two dielectric materials that have a relatively strong etching resistivity and a relatively weak etching resistivity to a predetermined etchant.

Figure 2:
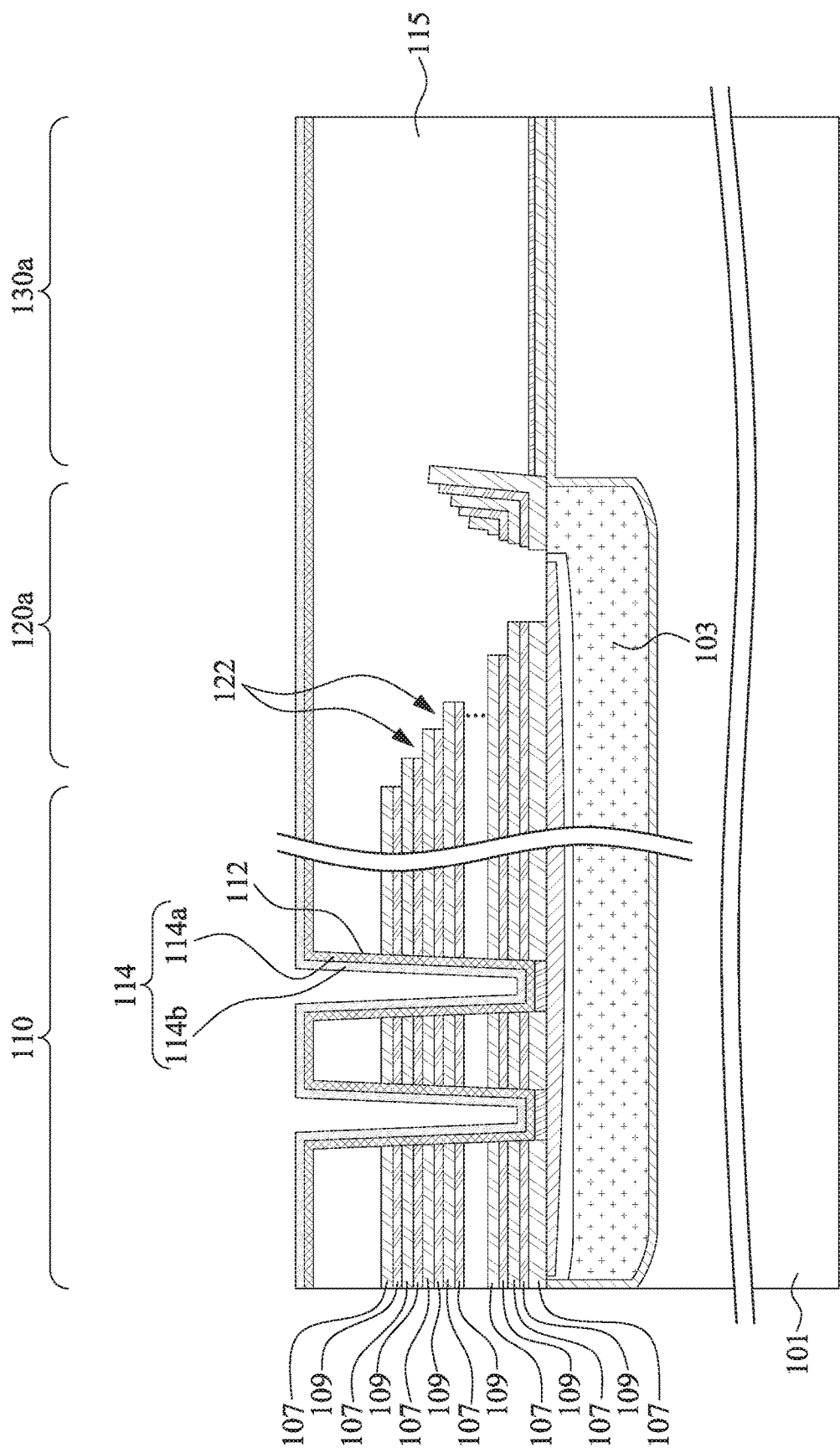
FIGS. 2-7 illustrate cross-sectional views (taken along the line A-A' in FIG. 1) of a method for manufacturing a semiconductor memory device at various stages in accordance with one embodiment of the present disclosure.

Referring to FIG. 2, the multi-layer stacked structure over the first region 103 of the substrate is etched to form a stair structure (in the bonding pad region 120a) and a non-stair structure (in the memory array region 110). The stair structure includes a plurality of steps 122. Each step 122 includes an immediately-adjacent pair of two different insulating layers (107, 109). A dielectric passivation layer 115 is formed to cover all regions (110, 120a, 130a) and followed by a planarization process, e.g., a CMP process. In some embodiments, the stair structure is closer to the peripheral region 130a than the non-stair structure is. The peripheral region 130a may also be referred as a second region of the semiconductor substrate, and the first region 103 and the peripheral region 130a are adjacent regions and located on the same side of the semiconductor substrate 101.

A plurality of holes 112 are formed in the non-stair structure, and each hole 112 passes through the two different insulating layers (107, 109) within the non-stair structure. From a top view, each hole 112 may have an O-shaped, oval-shaped, ellipse-shaped or rounded rectangular circumference, but not being limited thereto.

A storage layer 114a and a channel layer 114b are deposited in each hole 112 to form vertical memory structures 114. In some embodiments, the storage layer 114b may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ON-ONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer 114a includes an ONO layer stack and the channel layer 114b is made of poly-silicon.

Figure 3:
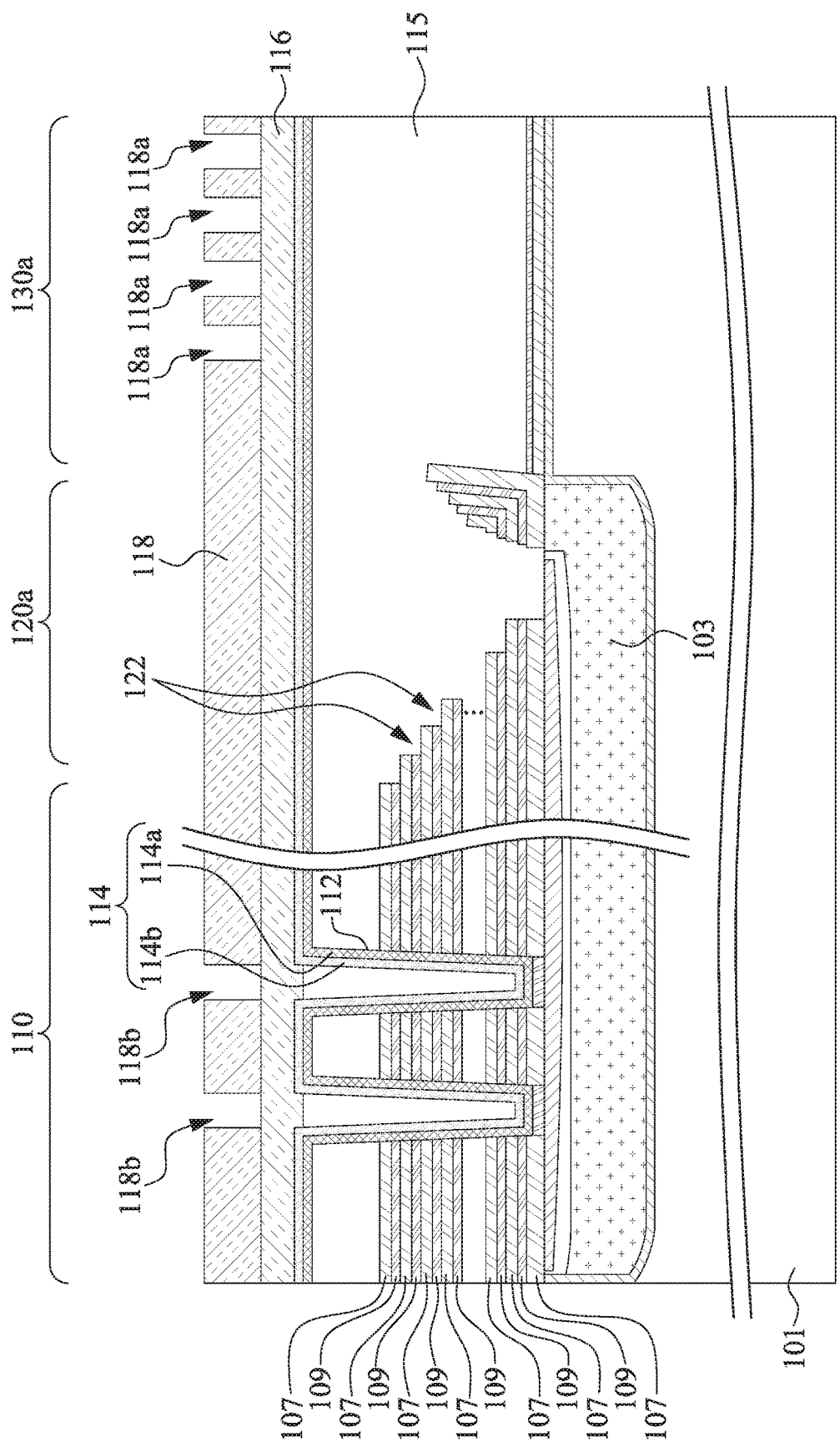

Referring to FIG. 3, a bottom anti-reflective coating layer 116 and a photo resist layer 118 are formed over all regions (110, 120a, 130a). The photo resist layer 118 is then patterned to form through holes 118a in the peripheral region 130a and through holes 118b in the non-stair structure. The through holes 118b are aligned with the holes 112 underneath.

Figure 4:
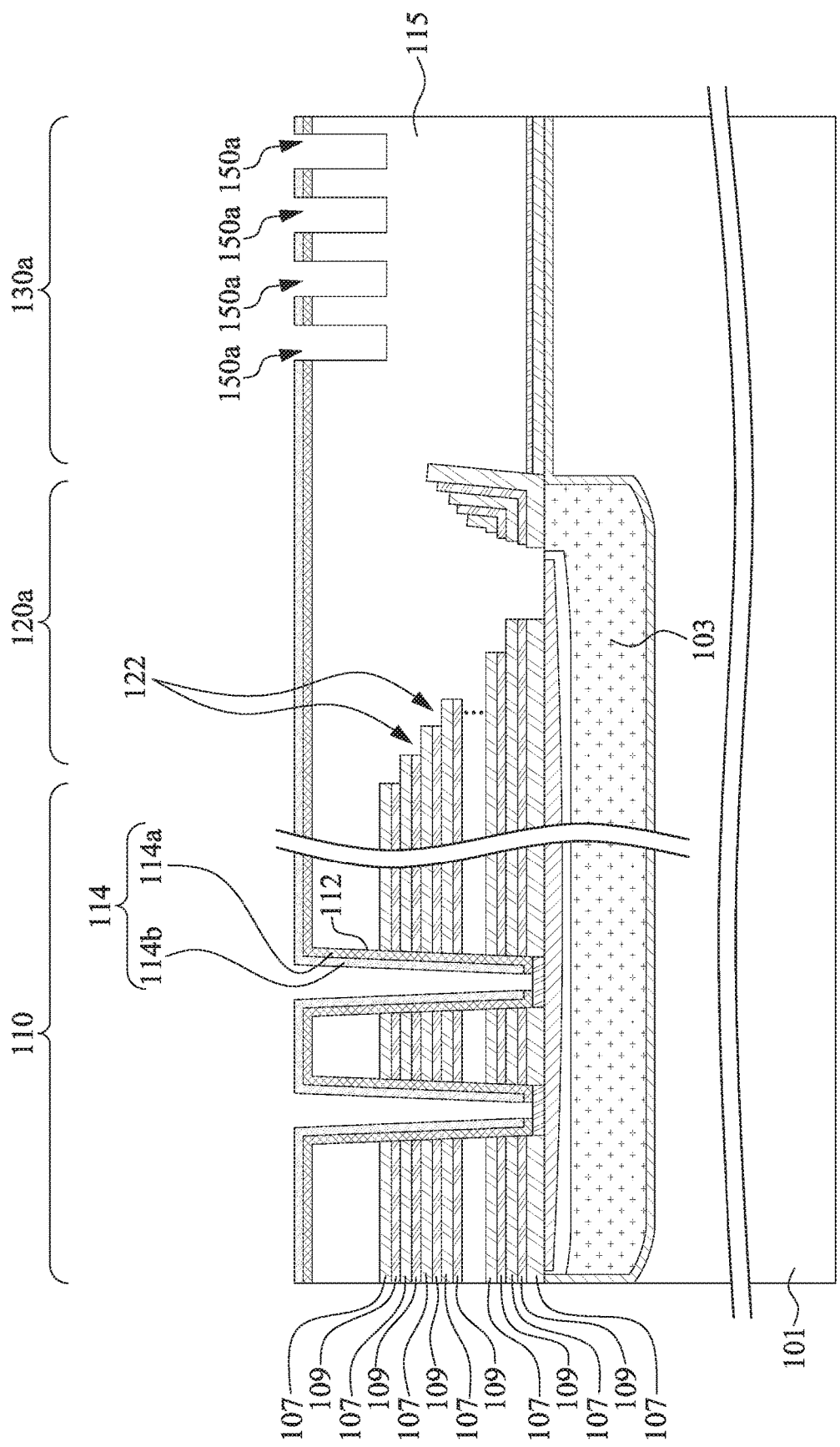

Referring to FIG. 4, an etch step is performed using the patterned photo resist layer 118 to cut through an bottom portion of the storage layer 114a and the channel layer 114b as well as to form holes 150a in the peripheral region 130a. The bottom anti-reflective coating 116 and the photo resist layer 118 are then removed. In some embodiments, the holes 150a are shallower than the holes 112.

Figure 5:
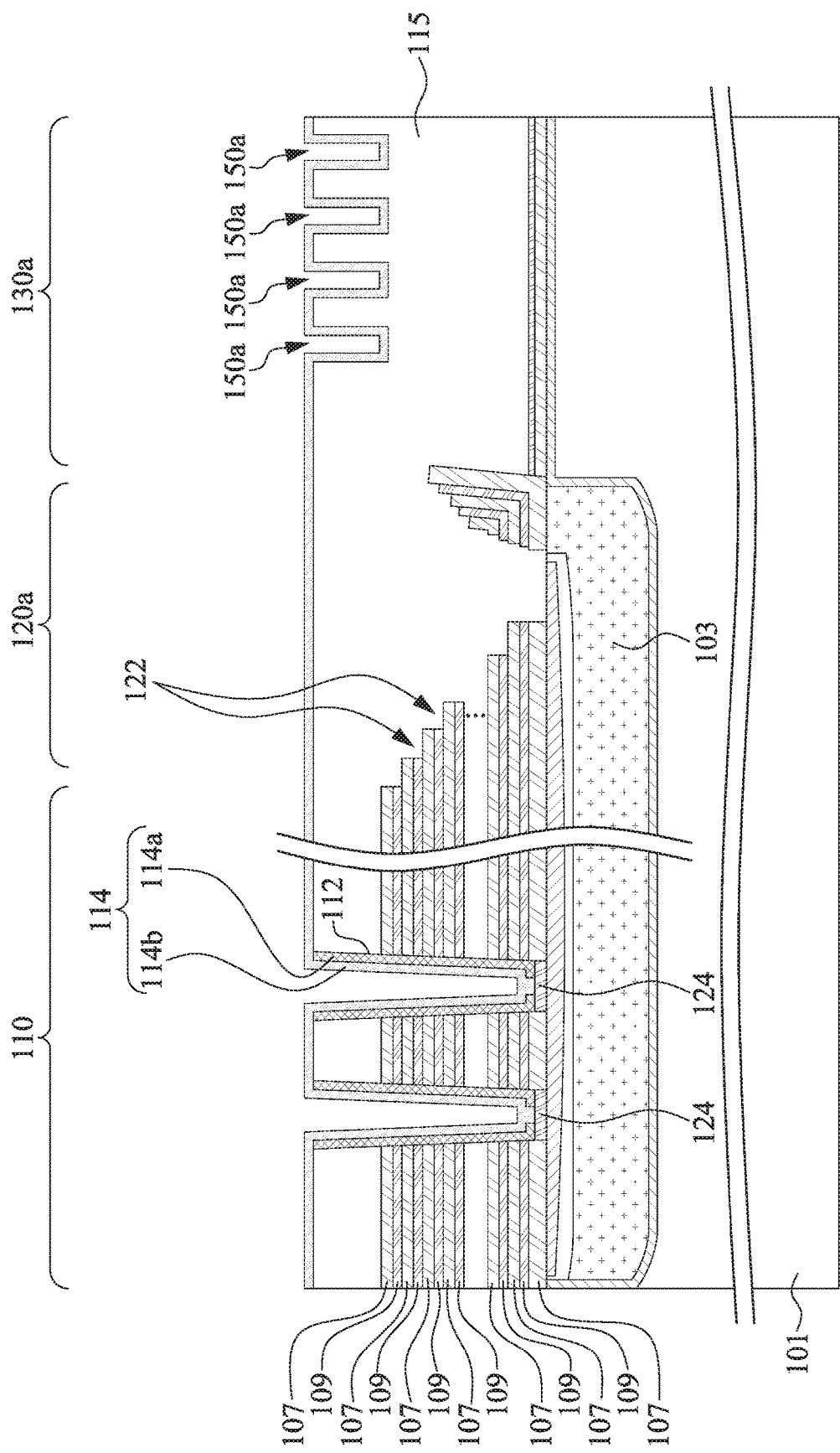

Referring to FIG. 5, a planarization process, e.g., a CMP process, is performed to remove excess materials of the storage layer 114a and the channel layer 114b out of the holes 112, and poly silicon are further deposited to fill the cut bottom portion of the storage layer 114a and the channel layer 114b as well as holes 150a in the peripheral region 130a. Therefore, the channel layer 114b is in contact with a self-epitaxial-growth (SEG) silicon 124 underneath.

Figure 6:
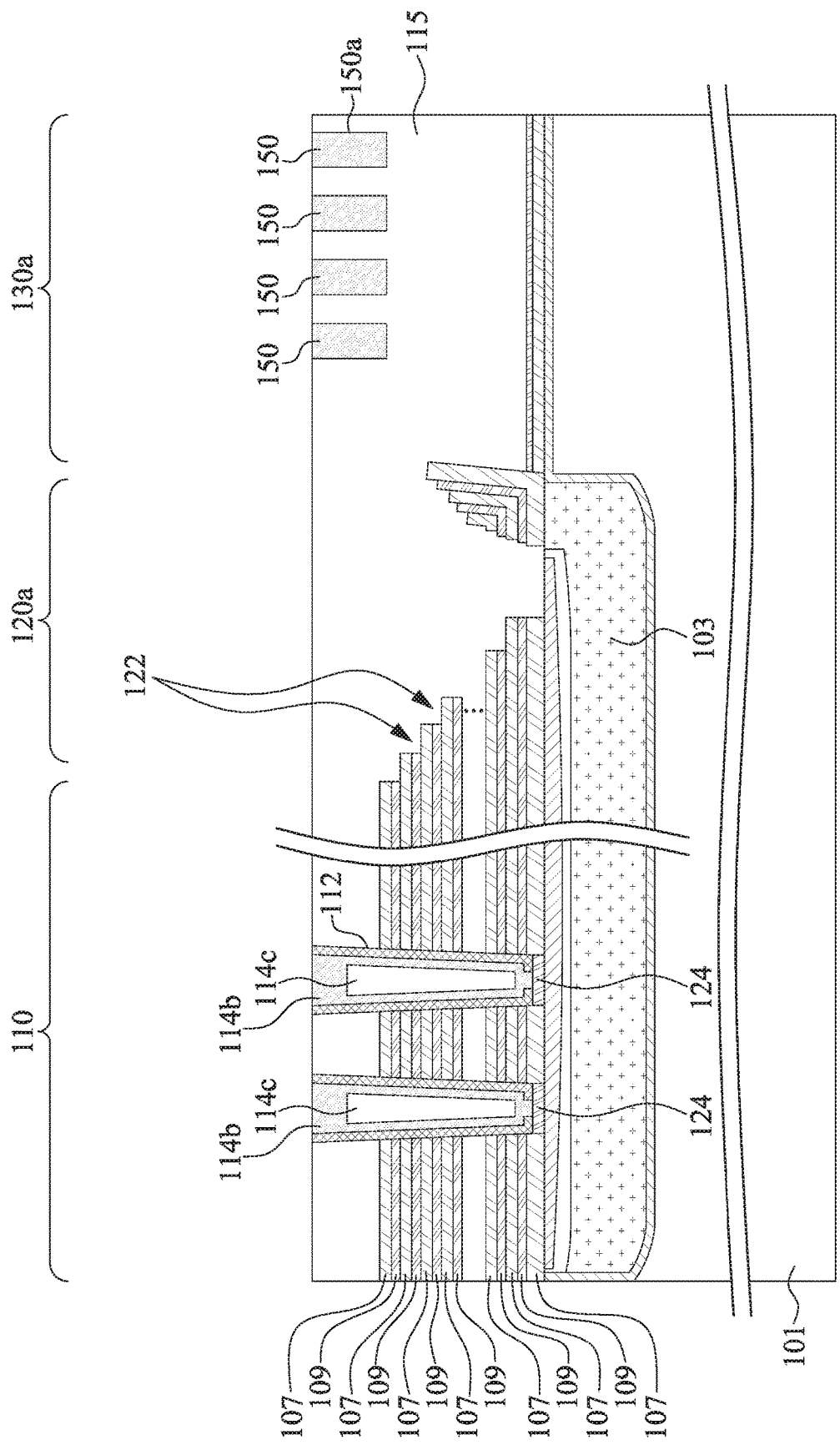

Referring to FIG. 6, an oxide layer 114c is deposited in the holes 112, and poly silicon is further deposited to fill in the holes 112 and the holes 150a. Therefore, the oxide layer 114c is wrapped around by poly silicon, i.e., the channel layer 114b, and each hole 150a is filled with poly silicon to form a poly silicon plug as a bow-height adjustment feature 150. Another planarization process, e.g., a CMP process, is performed to remove excess poly silicon materials. Next, a 650° C. anneal process may be performed for 4 fours to compensate wafer level bow heights. In this embodiment, the bow-height adjustment features 150 and the channel layers 114b are formed from same materials and steps, but not being limited thereto.

In some embodiments, the bow-height adjustment features 150 are spaced from one another and thus electrically insulated from one another. In some embodiments, the bow-height adjustment features 150 are spaced from the memory structures 114 and thus electrically insulated from the memory structures 114. In some embodiments, the bow-height adjustment features 150 have heights that are smaller than those of the memory structures 114.

Figure 7:
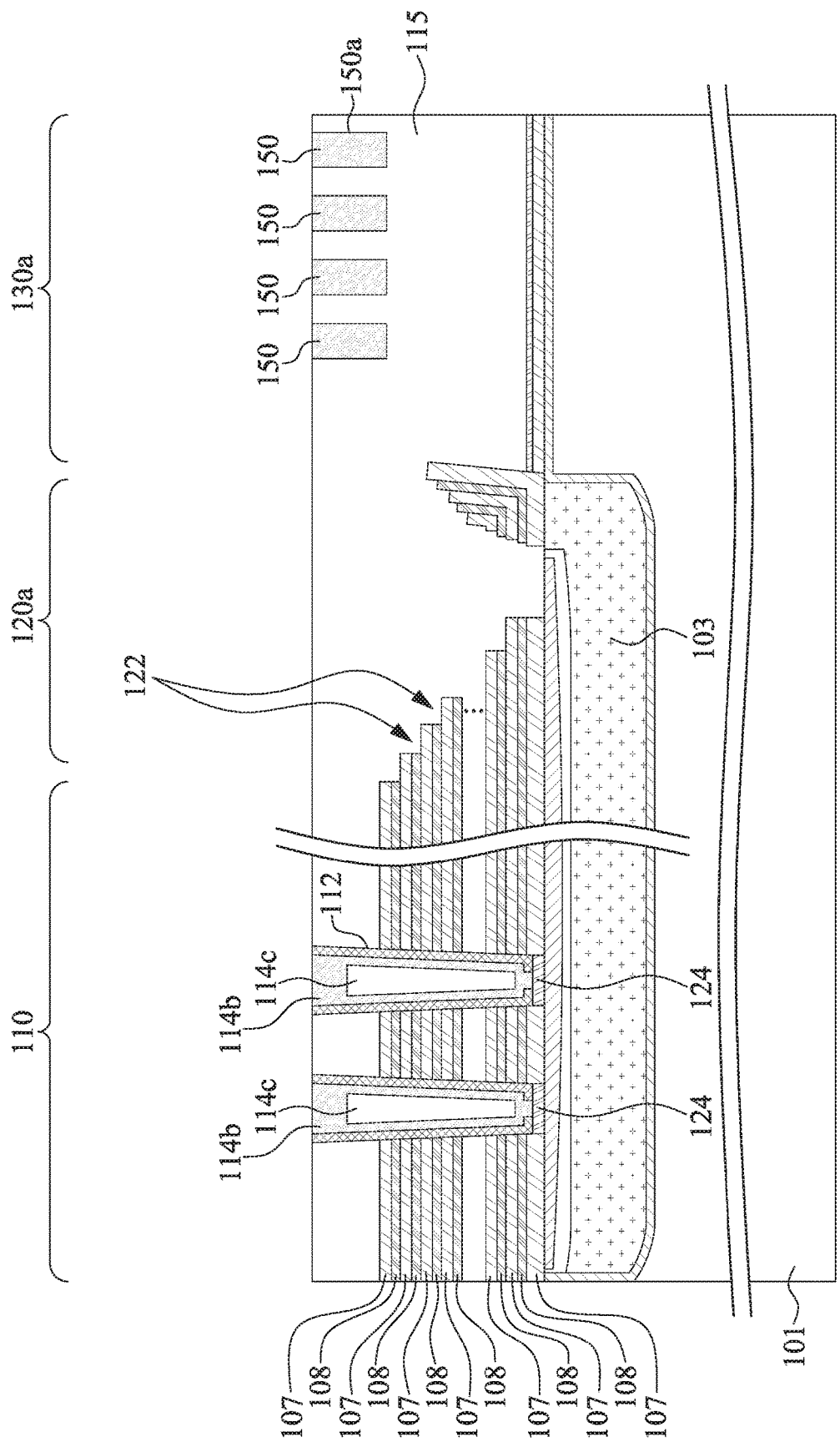

Referring to FIG. 7, a subsequent gate replacement process is performed to replace the insulating layers 109 with conductive layers 108, e.g., by removing the insulating layers 109 by a predetermined etchant that have a strong etching capability to the insulating layers 109 and a very weak or no etching capability to the insulating layers 107, and filling back conductive materials to form the conductive layers 108. Therefore, each step 122 of the stair structure includes an immediately-adjacent pair of the insulating layers and conductive layers (107, 108). In some embodiments, the peripheral region 130a is referred as a region where the multi-layer stacked structure (107, 108) is not presented, e.g., the multi-layer stacked structure is not presented under the bow-height adjustment features 150. In some embodiments, the bow-height adjustment features 150 are spaced from the conductive layers 108 and thus electrically insulated from the conductive layers 108. In some embodiments, each memory structure 114 may include gate-all-around transistors. In some embodiments, the bow-height adjustment features 150 and the multi-layer stacked structure (107, 108) are located on the same side, e.g., the top side, of the semiconductor substrate 101.

In some embodiments, the bow-height adjustment feature may be a poly silicon pad, e.g., poly silicon filled within a shallower hole with a greater diameter. In some embodiments, the bow-height adjustment features 150 are densely located within a region occupying at least 10% of an area of a peripheral region so as to minimize wafer level bow heights resulted from wafer warpage.

Reference is made to FIG. 8, which illustrates a cross-sectional view of a semiconductor memory device in accordance with another embodiment of the present disclosure. This embodiment is different from the previous embodiment in that bow-height adjustment features 152 in the peripheral region 130c are located on a lower side or back side of the semiconductor substrate 101. That is, the multi-layer stacked structure (107, 108) and the bow-height adjustment features 152 are located on opposite sides, e.g., the top side and the back side, of the semiconductor substrate 101 so as to minimize wafer level bow heights resulted from wafer warpage. The first region 103, the peripheral region 130a and the peripheral region 130c are located on opposite sides of the semiconductor substrate 101. In some embodiments, the bow-height adjustment features 152 may be poly silicon plugs or poly silicon pads.

According to aforementioned embodiments, a three-dimensional semiconductor memory device is equipped with bow-height adjustment features in the peripheral regions. The bow-height adjustment features are configured to compensate wafer level bow heights resulted from wafer warpage. The bow-height adjustment features may be poly silicon plugs or poly silicon pads that are located on the same side or on opposite sides of the semiconductor substrate, e.g., the second and third regions of semiconductor substrate.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A three-dimensional (3D) memory device, comprising:
   a plurality of conductive layers and insulating layers alternately formed to define a multi-layer stacked structure on a first region of a semiconductor substrate, wherein the multi-layer stacked structure comprises a stair structure and a non-stair structure;
   a plurality of memory structures disposed in the non-stair structure to form a memory array region, and each memory structure passing through the conductive layers and the insulating layers and comprising a storage layer and a channel layer; and
   a plurality of bow-height adjustment features disposed in a second region of the semiconductor substrate, wherein the bow-height adjustment features and the channel layers comprise the same material.

2. The 3D memory device of claim 1, wherein the bow-height adjustment features comprise poly silicon plugs.

3. The 3D memory device of claim 1, wherein the bow-height adjustment features comprise poly silicon pads.

4. The 3D memory device of claim 1, wherein the bow-height adjustment features are electrically insulated from one another.

5. The 3D memory device of claim 1, wherein the bow-height adjustment features are electrically insulated from the memory structures.

6. The 3D memory device of claim 1, wherein the bow-height adjustment features and the multi-layer stacked structure are disposed on the same side of the semiconductor substrate.

7. The 3D memory device of claim 1, wherein the stair structure is closer to the second region than the non-stair structure.

8. The 3D memory device of claim 1, wherein the stair structure comprises a plurality of steps, each step comprises an immediately-adjacent pair of the conductive layers and insulating layers.

9. The 3D memory device of claim 1, wherein the bow-height adjustment features occupy at least 10% of an area of the second region.

10. The 3D memory device of claim 1, wherein the bow-height adjustment features and the multi-layer stacked structure are disposed on opposite sides of the semiconductor substrate.

11. The 3D memory device of claim 1, wherein each of the memory structures comprises gate-all-around transistors.

12. A three-dimensional (3D) memory device, comprising:
    a plurality of conductive layers and insulating layers alternately formed to define a multi-layer stacked structure on a first region of a semiconductor substrate, the multi-layer stacked structure comprising a stair structure and a non-stair structure;
    a plurality of memory structures disposed in the non-stair structure and each passing through the conductive layers and the insulating layers;
    a second region, wherein the first region and the second region are adjacent to each other and disposed on a same side of the semiconductor substrate, and the stair structure is closer to the second region than the non-stair structure; and
    a plurality of bow-height adjustment features disposed in a third region of the semiconductor substrate disposed on a side of the semiconductor substrate that is opposite to the side on which the first and second regions are disposed.

13. The 3D memory device of claim 12, wherein the stair structure comprises a plurality of steps, each step comprises an immediately-adjacent pair of the conductive layers and insulating layers.

14. The 3D memory device of claim 12, wherein the bow-height adjustment features comprise poly silicon plugs.

15. The 3D memory device of claim 12, wherein the bow-height adjustment features comprise poly silicon pads.

16. The 3D memory device of claim 12, wherein each of the memory structures comprises gate-all-around transistors.

17. The 3D memory device of claim 12, wherein the bow-height adjustment features occupy at least 10% of an area of the second region.

\* \* \* \* \*